United States Patent [19]

Bayer et al.

[11]  4,275,348

[45]  Jun. 23, 1981

[54] METHOD OF AND SYSTEM FOR MEASURING THE TRANSMISSION CHARACTERISTICS OF FOUR-TERMINAL NETWORKS

[75] Inventors: Herbert Bayer, Reutlingen; Günther Hoffmann; Eberhard Schuon, both of Eningen, all of Fed. Rep. of Germany

[73] Assignee: Wandel & Goltermann, Eningen, Fed. Rep. of Germany

[21] Appl. No.: 6,759

[22] Filed: Jan. 26, 1979

[30]  Foreign Application Priority Data

Jan. 27, 1978 [DE]  Fed. Rep. of Germany ....... 2803608

[51] Int. Cl.$^3$ ............................................. G01R 27/00
[52] U.S. Cl. ................................ 324/57 R; 324/58 A
[58] Field of Search ........................... 324/57 R, 58 A

[56]  References Cited

U.S. PATENT DOCUMENTS 2,881,388  4/1959  Behrend ............................ 324/57 R

OTHER PUBLICATIONS

Watanabe et al.; "An Easily . . . "; IEEE Trans. on Instr. and Measurement; vol. IM-26; No. 4; Dec. 1977; pp. 309-312.

*Primary Examiner*—Ernest F. Karlsen
*Attorney, Agent, or Firm*—Karl F. Ross

[57]  ABSTRACT

To measure the transmission characteristics of a signal line or other four-terminal network, a multifrequency test signal is fed through that network via a first channel to one input of a differential amplifier whose other input receives via a second channel a substantially identical comparison signal. A difference signal in the output of the differential amplifier, after rectification and possible filtering, is used for manual or automatic adjustment of an amplifier (or attenuator) and a delay unit in either or both channels until the magnitude of that difference signal is a minimum, its residual value indicating frequency-dependent distortions such as background noise or phase jitter not removable by broad-band adjustment of signal level and phase delay. The test signal, advantageously provided by a generator of the pseudorandom type, may be delivered to the second channel by that generator ahead of the four-terminal network to serve as the comparison signal; alternatively, the latter signal may be produced on the output side of the tested network by an identical generator under the control of synchronizing pulses extracted from the measuring signal traversing that network.

20 Claims, 3 Drawing Figures

METHOD OF AND SYSTEM FOR MEASURING THE TRANSMISSION CHARACTERISTICS OF FOUR-TERMINAL NETWORKS

FIELD OF THE INVENTION

Our present invention relates to a method of and a system for measuring the transmission characteristics of a signal line or other four-terminal network over a broad frequency range.

BACKGROUND OF THE INVENTION

A knowledge of the transmission characteristics of a signal path is required for the elimination of distortions at the receiving end. In many instances it is necessary to determine these characteristics both for the overall frequency range and for a number of narrower bands (e.g. voice channels) encompassed within that range. Such distortions include background noise, phase jitter and frequency-dependent amplitude and phase variations.

Conventional methods of determining the characteristics of transmission systems generally involve the evaluation, at the receiving end of a signal path, of a predetermined test signal fed to that path at the transmitting end. Thus, for example, the broad-band attenuation distortion can be measured by averaging the squared attenuation variations observed in different parts of the spectrum. This technique, however, disregards other signal-distorting parameters such as phase variations, nonlinearity and noise. A determination of attenuation and group delay as a function of frequency is usually carried out with the aid of a modulated sine wave, yet this requires a proper correlation of the modulation at the transmitting end with the evaluation at the receiving end which creates difficulties in the testing of long transmission lines. The frequency dependence of the group delay requires a time-consuming integration of the phase characteristics. Noise measurements are usually carried out in the absence of a test signal.

OBJECTS OF THE INVENTION

An object of our present invention is to provide an improved method of measuring, with the aid of one test signal, several of the aforementioned characteristics determining the transmission quality of a four-terminal network.

A related object is to provide simple and inexpensive means for performing these measurements.

SUMMARY OF THE INVENTION

In accordance with our invention, a multifrequency test signal is fed to the input of the four-terminal network to be examined, resulting in a distorted signal at the network output which is supplied to one input of a comparator such as a differential amplifier. The other input of the comparator simultaneously receives a comparison signal which is substantially identical with the undistorted test signal. The amplitude ratio and the relative time lag of the distorted and comparison signals delivered to the comparator are varied, continuously or in steps, until a difference signal issuing from the comparator has a minimum magnitude which can then be registered as a measure of noncompensable residual distortion. The corresponding amplitude and delay adjustments, preferably registered jointly with the RMS value of the difference signal, represent the average amplitude and phase distortions over the entire range of test frequencies.

The parameters thus registered can be utilized in designing an equalizer for eliminating the distortions referred to.

The noncompensable residual distortions, including noise and phase jitter, may be broken down for different subranges by selective filtering of the difference signal and/or of the test and comparison signals.

The comparison signal may be derived directly from the test signal through the use of a common generator, preferably one of the pseudorandom type, working into the network to be examined as well as into the other comparator input. When the network is a long transmission line, however, such an arrangement would require a separate transmission path of like length for the comparison signal generated at the transmitting end. Especially in such a case, therefore, we prefer to provide a substantially identical signal generator at the receiving end and to correlate the operations of the two signal generators with the aid of synchronizing pulses extracted from the network output. Signal generators of the pseudorandom type may include tapes or other recording media with a preferably adjustable recurrence period which could be chosen with particular regard to the type of network to be examined. In the case of a TV cable, for example, that recurrence period could equal a line-scanning cycle.

The test and comparison signals, may be a train of rectangular binary pulses rich in higher harmonics. The signals could be weighted in favor of frequencies predominantly transmitted through the network in its normal use, such as voice frequencies in the case of a telephone system.

The adjustment of the amplitude ratio of the distorted and comparison signals may be carried out by variable attenuation or amplification means, preferably the latter, in either of the two signal channels leading to the differential amplifier. Since—especially with long transmission lines—the test signal may be considerably attenuated in passing through the network to be examined, it is usually advantageous to insert level-control means in the form of an adjustable amplifier in the channel carrying the distorted signal. An adjustable delay device for varying the relative timing phase may then be inserted in the other channel though it could also be connected in series with the level-control means. In any event, timing and level variations may be controlled automatically through a feedback loop extending from a difference-signal detector in the output of the differential amplifier, that feedback loop advantageously including a microcomputer programmed to adjust the level-control means and delay means in uniform increments; the extent of either adjustment can then be measured by counting the number of incremental steps taken by the microcomputer. The level adjustment may be calibrated in absolute values or in terms of a given reference value; since absolute group delays are generally of little practical interest, the delay adjustment is advantageously measured in terms of a zero reference phase established for a predetermined test frequency for which the distorted test signal in the output of the network and the comparison signal are precisely synchronized. If the test and comparison signals are filtered to eliminate all but a single spectral frequency within the range of interest, the phase shift $\phi$ for that frequency may be determined by multiplying the measured delay $\tau$ with the corresponding pulsatance $\omega$.

BRIEF DESCRIPTION OF THE DRAWING

The above and other features of our present invention will now be described in detail with reference to the accompanying drawing in which.

SPECIFIC DESCRIPTION

Figure 1:
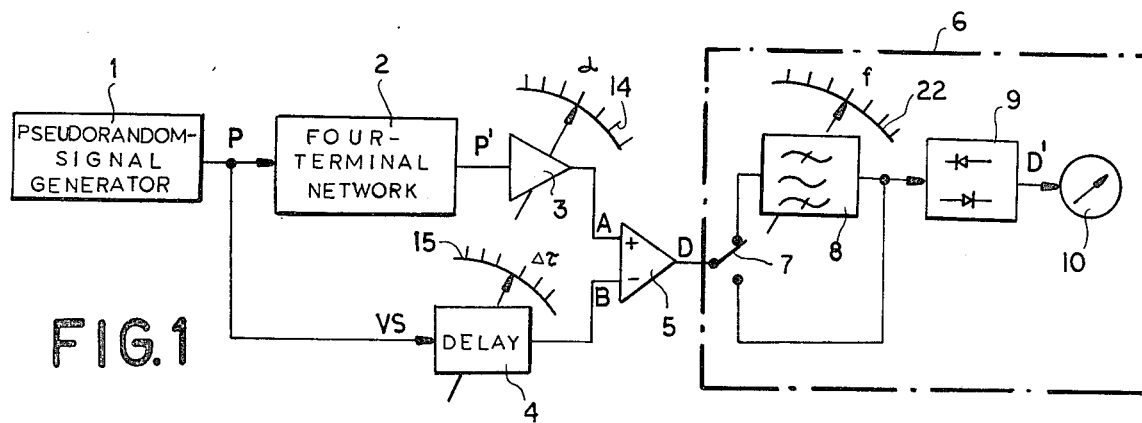
FIGS. 1, 2 and 3 are block diagrams of respective embodiments.

In FIG. 1 we have shown a generator 1 of a pseudo-random multifrequency signal P feeding a four-terminal network 2 to be tested. The test signal P is also transmitted, as a comparison signal VS, to an adjustable delay line 4 in parallel with network 2. A distorted signal P' appearing in the output of that network is delivered via an adjustable amplifier 3 to an input A of a differential amplifier 5 whose other input B receives the comparison signal VS from delay line 4. A difference signal D appearing in the output of amplifier 5 is fed to a detector stage 6 shown to include an RMS rectifier 9 working into a visual indicator 10. A switch 7 permits the signal D to be routed to rectifier 9 by way of a band-pass filter 8 which can be selectively adjusted to different frequency bands within the range of test frequencies encompassed by signal P. The gain $\alpha$ of amplifier 3, the delay $\Delta\tau$ introduced by line 4 and the midfrequency f of the band passed by filter 8 can be read on respective scales 14, 15 and 32. Network 2 may comprise a transmission line possibly provided with a test modulator on its upstream end and a corresponding demodulator on its downstream end.

In testing the network 2 by the system of FIG. 1, amplifier 3 is adjusted until the RMS value D' of the difference signal D is at a minimum as read on instrument 10. Next, delay line 4 is adjusted to reduce the indicator reading still further, if possible. (The sequence of adjusting the amplifier 3 and the delay device 4 could obviously be interchanged if desired.) These operations can be carried out for a selected narrow frequency band, with suitable adjustment of filter 8 and with switch 7 in its illustrated position, or for the entire frequency range with switch 7 in its alternate position.

Figure 2:
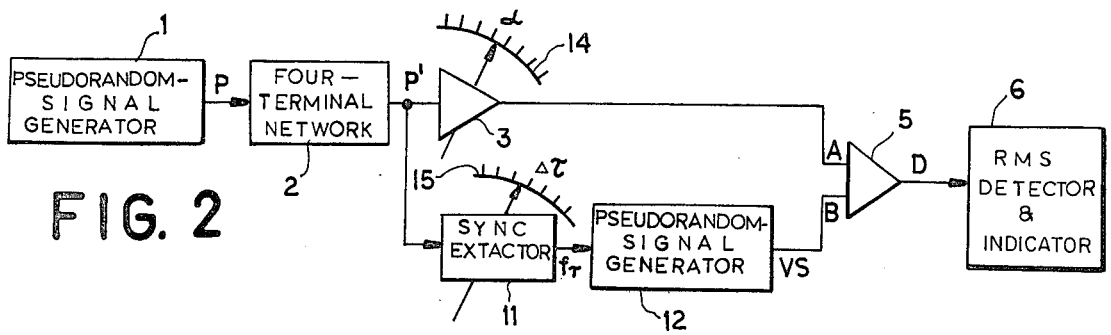

In FIG. 2 we have shown a generally similar system in which, however, generator 1 delivers only the test signal P to network 2. The distorted signal P' issuing from that network is delivered to a synchronization extractor 11, connected in parallel with adjustable amplifier 3, which may respond to special high-level pulses periodically recurring within the pseudorandom test signal P. The extracted sync pulses are converted into timing pulses of clock frequency $f_T$ controlling another pseudorandom-signal generator 12, substantially identical with generator 1, which emits a comparison signal VS corresponding to test signal P. The two signal generators 1 and 12 may include, for example, pick-up heads coacting with identical magnetic tapes. The distorted signal P', amplified as before by component 3, is again fed to an input A of a differential amplifier 5 whose input B receives the comparison signal VS from generator 12. The resulting difference signal D is delivered, as in FIG. 1, to an RMS detector 6.

The synchronization extractor 11 of FIG. 2 is adjustable to vary the lag between the incoming sync pulses and the outgoing timing pulses so as to introduce a delay $\Delta\tau$ which can again be read on a scale 15; the extractor, accordingly, also plays the part of delay device 4 shown in FIG. 1.

The system of FIG. 2 eliminates the need for a signal channel paralleling the network 2 to carry the comparison signal VS from generator 1 as shown in FIG. 1. Alternatively, however, we may dispense with the synchronization extractor 11 by using a synchronization signal separately transmitted via a narrow-band path from generator 1 to the control input of generator 12 at the receiving end of the network. In that case, of course, a delay device such as the line 4 of FIG. 1 will have to be inserted in cascade with generator 12, either on its input side to change the timing of the control pulses or on its output side to delay the comparison signal VS, for the purpose of time lag adjustment.

Figure 3:
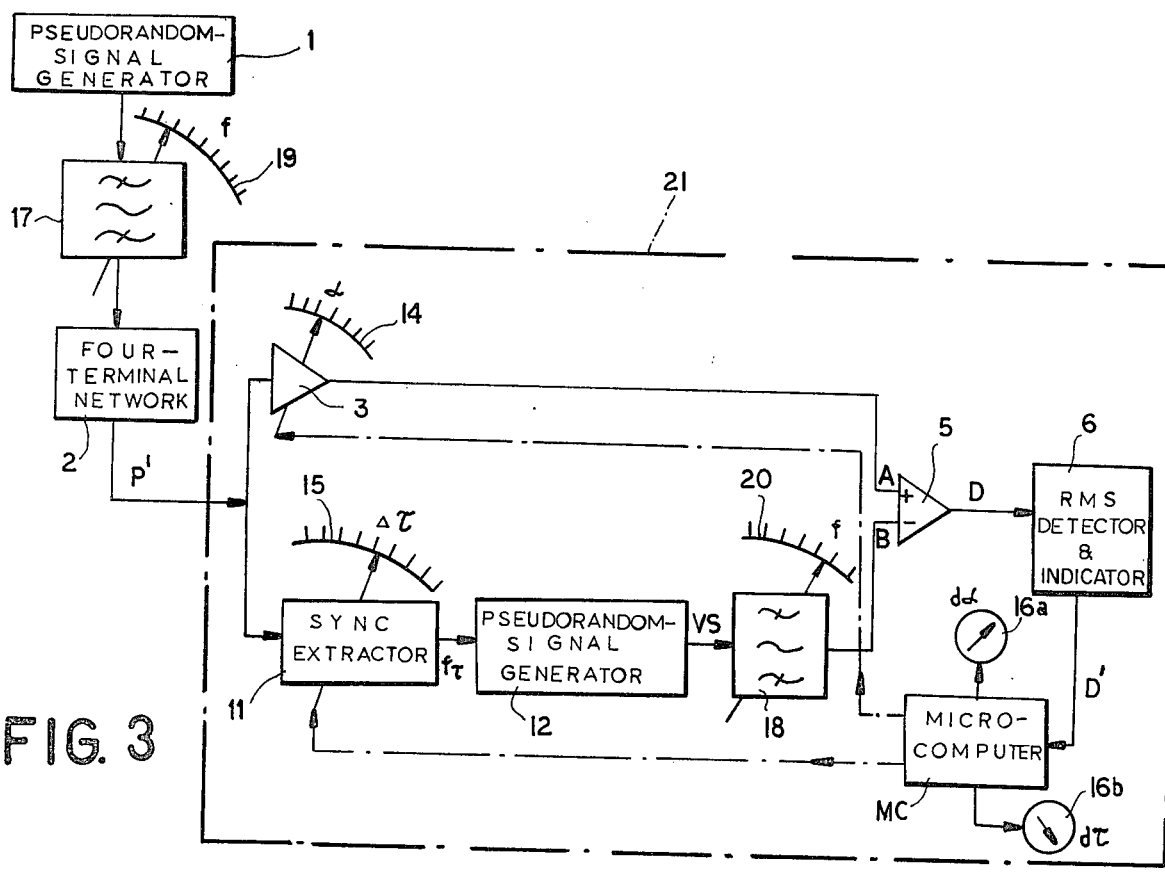

In FIG. 3 we have shown a receiving station 21 for the processing of the distorted signal P' from network 2 with the aid of an adjustable amplifier 3, a differential amplifier 5, a synchronization extractor 11, a signal generator 12 and an RMS detector 6 all as described above with reference to FIG. 2. In this instance, however, the level-control means 3 and the delay means 11 are automatically adjusted under the control of an error signal D' from detector 6 (see also FIG. 1) via a feedback path which includes a microcomputer MC. The microcomputer is programmed to perform the aforedescribed adjustments of amplifier 3 and extractor 11 until the error signal D' has a minimum magnitude. The gain-adjusting increments $d\alpha$ and the delay-adjusting increments $d\tau$ needed for this purpose are counted and registered on respective indicators 16a and 16b. The microcomputer may also control a nonillustrated equalizer at the output end of network 2, adjusting its overall attenuation and timing in accordance with the readings of indicators 16a and 16b. Selective adjustments for different frequency bands may be carried out with the aid of two band-pass filters 17 and 18 respectively inserted in the outputs of signal generators 1 and 12; these filters are to be set to identical pass bands that are read on respective frequency scales 19 and 20.

Receiver 21 may be normally inactive and may be activated periodically, with concurrent activation of the test-signal generator 1 at the transmitting end, to determine whether an error signal D' derived from the incoming test frequencies does or does not fall within predetermined tolerance limits.

We claim:

1. A method of measuring the transmission characteristics of a four-terminal network, comprising the steps of:
   feeding a multifrequency test signal to the input of the four-terminal network and receiving a distorted signal from the output thereof;
   supplying said distorted signal and a comparison signal substantially identical with said test signal to respective inputs of a comparator for producing a difference signal;
   varying the amplitude ratio and the relative timing of said distorted and comparison signals to minimize the average amplitude and phase distortions of all frequency components thereof until said difference signal has a minimum magnitude; and
   registering said minimum magnitude as a measure of non-compensable residual distortions along with the amplitude ratio and relative time lag producing said minimum magnitude.

2. A method as defined in claim 1 wherein said test and comparison signals are binary signals subjected to pseudorandom variations.

3. A method as defined in claim 1 or 2, comprising the further step of filtering said difference signal to ascertain said residual distortions for a plurality of different frequency bands within the frequency range encompassed by said test signal.

4. A method as defined in claim 1 or 2 wherein said test and comparison signals are obtained from a common signal generator.

5. A method as defined in claim 4 wherein said test signal is obtained from a first signal generator and said comparison signal is obtained from a second signal generator operating in step with said first signal generator but with a time difference under the control of synchronizing pulses extracted from the output of said four-terminal network.

6. A method as defined in claim 1 or 2 wherein said amplitude ratio and relative timing are adjusted in uniform increments to arrive at said minimum magnitude and are registered by counting the number of said increments.

7. A method as defined in claim 5 wherein said relative timing is varied by introducing an adjustable lag into the operation of said second signal generator.

8. A system for measuring the transmission characteristics of a four-terminal network, comprising:
   signal-generating means for producing a multifrequency test signal and a comparison signal substantially identical with said test signal;
   a differential amplifier;
   first circuit means for feeding said test signal from said signal-generating means by way of said four-terminal network as a distorted signal to one input of said differential amplifier;
   second circuit means for feeding said comparison signal from said signal-generating means to another input of said differential amplifier;
   detector means connected to said differential amplifier for receiving therefrom a difference signal;
   level-control means in one of said circuit means for varying the amplitude ratio of said distorted and comparison signals;
   adjustable delay means for varying the relative timing of said distorted and comparison signals; and
   indicator means for registering the relative timing and amplitude ratio corresponding to a minimum magnitude of said difference signal and for further registering said minimum magnitude.

9. A system as defined in claim 8 wherein said signal-generating means comprises a source of pseudorandom binary signals connected to said first circuit means.

10. A system as defined in claim 9 wherein said second circuit means is connected to said source in parallel with said four-terminal network.

11. A system as defined in claim 9 wherein said delay means comprises a synchronization extractor connected to the output of said four-terminal network and a pseudorandom-signal generator substantially identical with said source controlled by said extractor for feeding said comparison signal with an adjustable lag to said second circuit means.

12. A system as defined in claim 11, further comprising a pair of identical band-pass filters insertable in said first and second circuit means for limiting said test and comparison signals to a selected frequency band substantially smaller than the frequency range of said source.

13. A system as defined in claim 11 or 12 wherein said delay means forms part of said extractor.

14. A system as defined in claim 8, 9 or 11 wherein said level-control means comprises an amplifier included in said first circuit means.

15. A system as defined in claim 14 wherein said delay means is included in said second circuit means.

16. A system as defined in claim 8, 11 or 12, further comprising a feedback loop extending from said detector means to said level-control means and to said adjustable delay means for automatically establishing said minimum magnitude.

17. A system as defined in claim 16 wherein said feedback loop includes a microcomputer programmed to adjust said level-control means and adjustable delay means in uniform increments.

18. A system as defined in claim 8, 9 or 11, further comprising adjustable filter means insertable between said differential amplifier and said detector means for limiting said difference signal to a selected frequency band substantially smaller than the frequency range encompassed by said test signal.

19. A system for measuring the transmission characteristics of a four-terminal network, comprising:
   first signal-generating means upstream of said four-terminal network for producing a multifrequency test signal;
   second signal-generating means remote from said first signal-generating means for producing a comparison signal substantially identical with said test signal;
   a differential amplifier;
   first circuit means for feeding said test signal from said first signal-generating means by way of said four-terminal network as a distorted signal, accompanied by periodically recurrent pulses, to one input of said differential amplifier;
   detector means connected to said differential amplifier for receiving therefrom a difference signal;
   level-control means in one of said circuit means for varying the amplitude ratio of said distorted and comparison signals;
   a synchronization extractor responsive to said recurrent pulses connected to the output of said four-terminal network for adjustably controlling said second signal-generating means to vary the relative timing of said distorted and comparison signals; and
   indicator means for registering the relative timing and amplitude ratio corresponding to a minimum magnitude of said difference signal and for further registering said minimum magnitude.

20. A system as defined in claim 19, wherein said first and second signal-generating means each comprises a generator of pseudorandom binary signals.

* * * * *